United States Patent
Lensing

(12) 
(10) Patent No.: US 6,625,514 B1
(45) Date of Patent: Sep. 23, 2003

(54) METHOD AND APPARATUS FOR OPTICAL LIFETIME TRACKING OF TRENCH FEATURES

(75) Inventor: Kevin R. Lensing, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 239 days.

(21) Appl. No.: 09/863,569

(22) Filed: May 23, 2001

(51) Int. Cl.⁷ .............................. G06F 19/00
(52) U.S. Cl. .................. 700/121; 216/60; 356/626
(58) Field of Search .................. 700/121, 108, 700/110, 32; 438/14, 634, 700; 216/60; 356/626

(56) References Cited

U.S. PATENT DOCUMENTS

| | | | |
|---|---|---|---|
| 5,807,761 A | * 9/1998 | Coronel et al. | 216/60 |
| 6,051,348 A | 4/2000 | Marinaro et al. | 430/30 |
| 6,245,584 B1 | 6/2001 | Marinaro et al. | 438/14 |
| 6,306,669 B1 | * 10/2001 | Yano et al. | 438/14 |
| 6,388,756 B1 | * 5/2002 | Ho et al. | 356/626 |
| 6,472,324 B2 | * 10/2002 | Kusakabe et al. | 438/700 |
| 6,524,163 B1 | * 2/2003 | Stirton | 438/401 |

* cited by examiner

*Primary Examiner*—Albert W. Paladini
(74) *Attorney, Agent, or Firm*—Williams, Morgan & Amerson, P.C.

(57) ABSTRACT

A method and an apparatus for performing process lifetime tracking of trench feature using optical analysis. A plurality of process steps is performed on a first set of semiconductor wafers. A manufacturing lifetime tracking of trench features is performed. A feedback corrective process is performed on a second set of semiconductor wafers based upon the lifetime tracking trench features. A feed-forward corrective process is performed on the first set of semiconductor wafers based upon the manufacturing lifetime tracking of trench features.

40 Claims, 11 Drawing Sheets

METHOD AND APPARATUS FOR OPTICAL LIFETIME TRACKING OF TRENCH FEATURES

BACKGROUND OF THE INVENTION

1. Field of the Invention

This invention relates generally to semiconductor manufacturing, and, more particularly, to a method and apparatus for performing process lifetime tracking of trench feature using optical analysis.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using a semiconductor manufacturing tool called an exposure tool or a stepper. Typically, an etch process is then performed on the semiconductor wafers to shape objects on the semiconductor wafer, each of which may function as a gate electrode for a transistor. Typically, shallow trench isolation (STI) structures formed on the semiconductor wafers being processed are filled by forming silicon oxide using tetraethoxysilane to (TEOS), over the STI structures. The manufacturing tools communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features, such as a polysilicon line, or opening-type features, that are to be replicated in an underlying process layer.

Turning now to FIG. 2, a silicon substrate 210 that contains at least one layer (layer 220), is shown. In one embodiment, a layer of silicon nitride is added onto a surface 215 of the silicon substrate 210, producing the layer 220. Typically, a plurality of STI structures 240 are etched into the silicon substrate 210. Generally, rounding of the corners can occur during the production of the STI structures 240. Currently, prolifilometer and scanning electron microscopes (SEM) are used to calculate and measure an inline depth 250, a profile of the STI structures 240, and the like. However, these measurements can contain inaccuracies, which may cause errors during semiconductor wafer manufacturing processes.

Turning now to FIG. 3, a pre-polished layer of TEOS fill material, which is represented by layer 230, is shown deposited on the silicon substrate 210. Upon deposition of the TEOS material onto the silicon substrate 210 and the layer 220, one or more seams 310 may develop above the STI structures 240. In addition to the seams 310, one or more keyholes 320 may develop within the STI structures 240. The keyholes 320 can cause significant weaknesses, leakage problems, and other errors to occur in the semiconductor wafer. Current methods of detecting seams 310 and keyholes 320 generally require inefficient interruption of process flow and/or destructive testing of sample semiconductor wafers 105.

Turning now to FIG. 4, a silicon substrate 210 that has been subjected to a post TEOS polish process and a silicon nitride layer strip process, is illustrated. The STI structures 240 are left with a field oxide 410 filling within the STI structures 240. In one embodiment the field oxide comprises a silicon oxide material deposited using TEOS. The integrity of the field oxide 410, may be compromised by the existence of keyholes 320. Again, the detection of keyholes requires inefficient interruption of the manufacturing process flows and/or destructive testing to examine cross-sections of the STI structures 240.

The present invention is directed to overcoming, or at least reducing the effects of, one or more of the problems set forth above.

SUMMARY OF THE INVENTION

In one aspect of the present invention, a method is provided for performing process lifetime tracking of trench features. A plurality of process steps is performed on a first set of semiconductor wafers. A manufacturing lifetime tracking of trench features is performed. A feedback corrective process is performed on a second set of semiconductor wafers based upon the lifetime tracking trench features. A feed-forward corrective process is performed on the first set of semiconductor wafers based upon the manufacturing lifetime tracking of trench features.

In another aspect of the present invention, a system is provided for performing process lifetime tracking of trench features. The system of the present invention comprises: a computer system; a manufacturing model coupled with the computer system, the manufacturing model being capable of generating and modifying at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; an optical data reference library, the scatterometry reference library comprising optical data related to a plurality trench data; and an optical data error analysis unit coupled to the metrology tool and the optical data reference library, the optical data error analysis unit capable of comparing the metrology data to corresponding data in the optical data reference library and performing a process lifetime tracking of trench features.

BRIEF DESCRIPTION OF THE DRAWINGS

The invention may be understood by reference to the following description taken in conjunction with the accompanying drawings, in which like reference numerals identify like elements, and in which.

Figure 1:
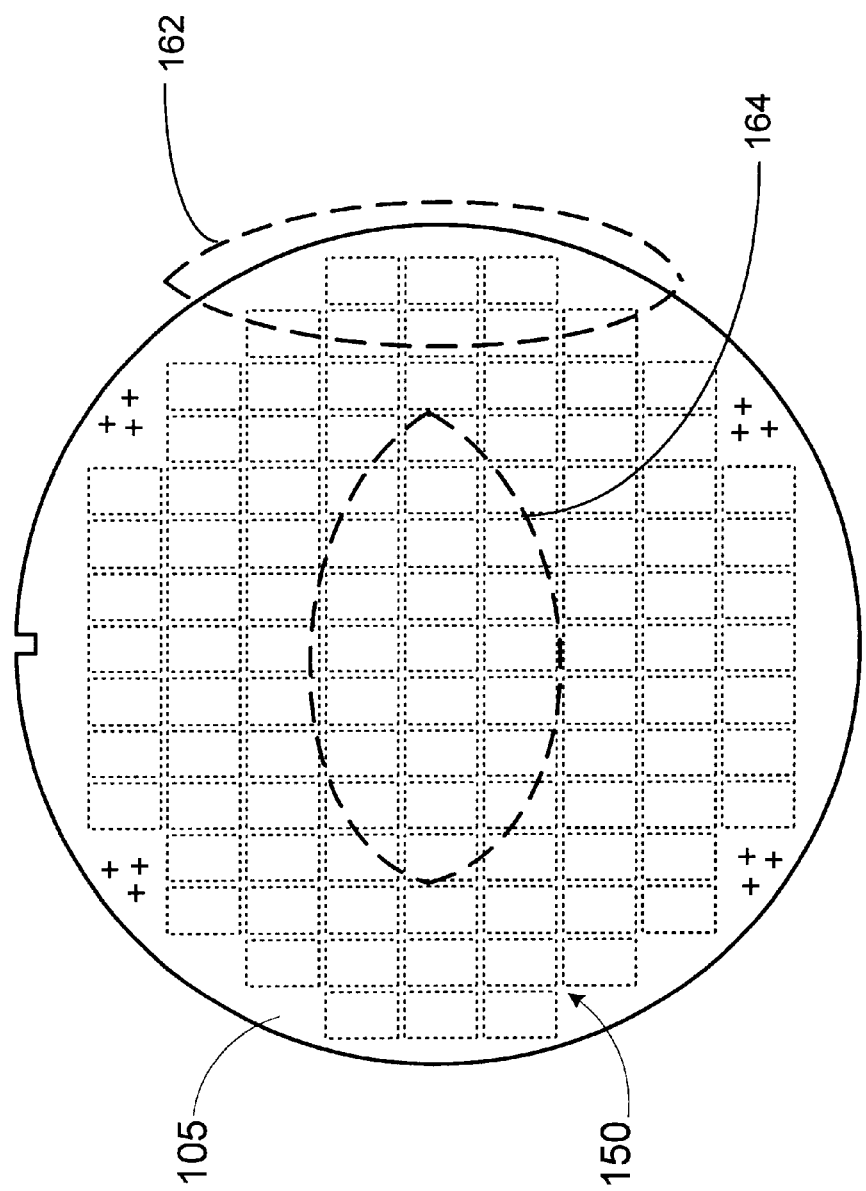
FIG. 1 is a simplified diagram of a prior art semiconductor wafer being processed.
Figure 2:
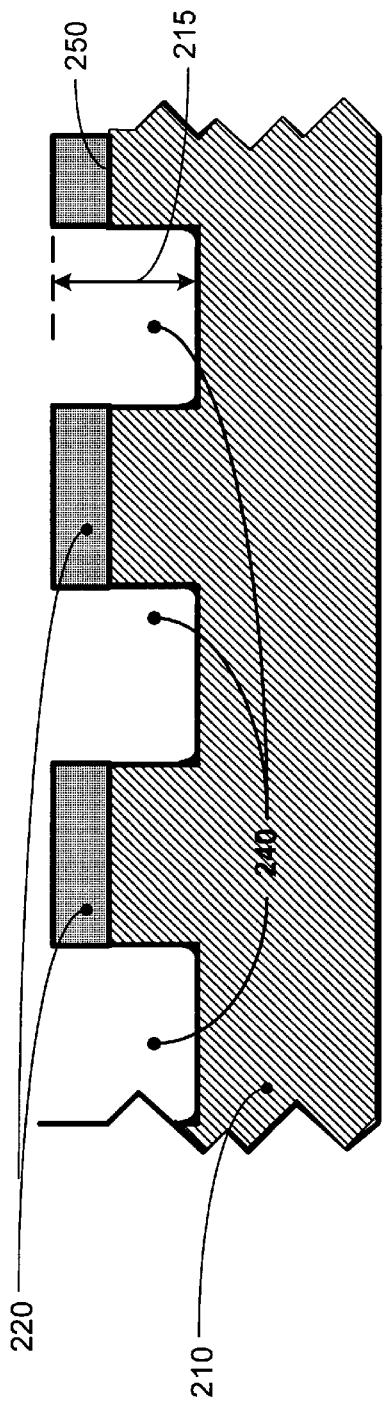
FIG. 2 illustrates a cross-sectional view of a silicon substrate that contains at least one layer.
Figure 3:
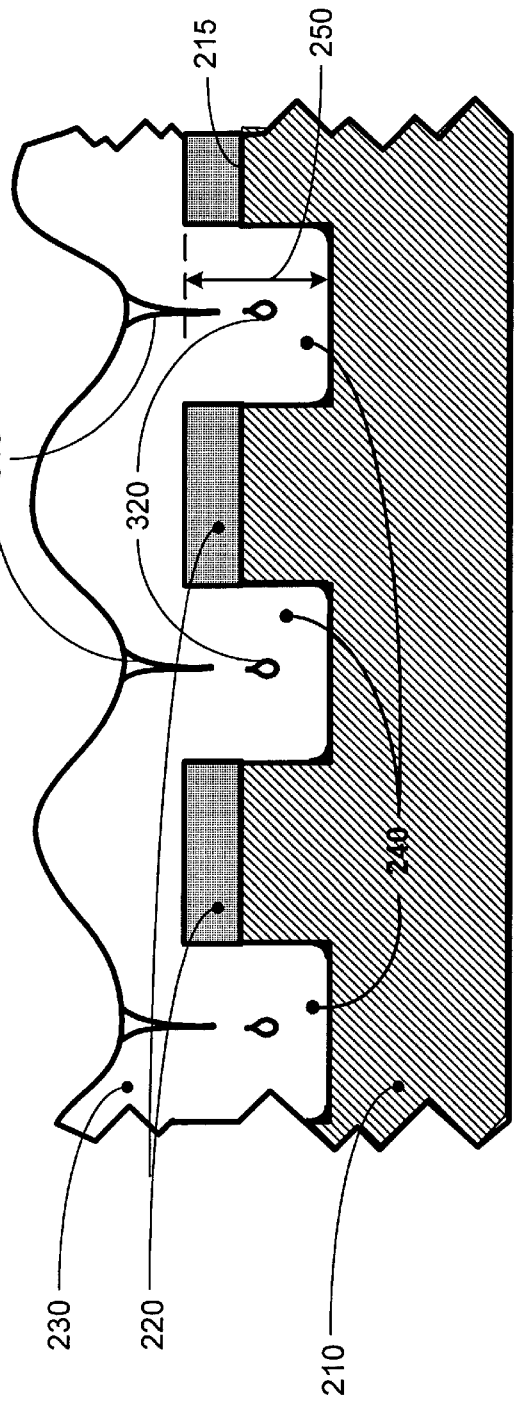
FIG. 3 illustrates a cross-sectional view of a silicon substrate that contains a plurality of layers, including a TEOS fill layer.
Figure 4:
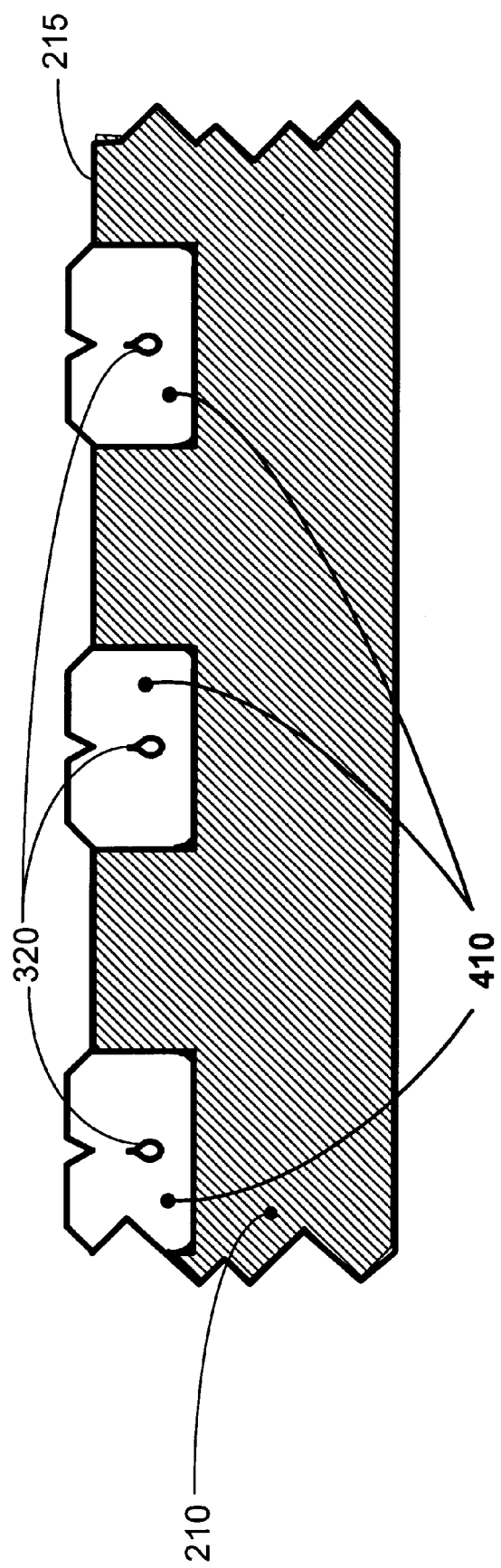
FIG. 4 illustrates a cross-sectional view of a silicon substrate that contains a plurality of layers where a layer has been subjected to a polish process.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Errors that can occur during the formation and filling of structures, such as STI structures, on semiconductor wafers being processed, which can cause significant degradation of the wafers being manufactured. Embodiments of the present invention utilize an optical data acquisition tool, such as a scatterometer, ellipsometer, and the like, to detect and/or to reduce errors that may occur during a process lifetime of STI structure processing. In one embodiment, the term "scatterometer" represents optical modeling of one or more outputs from a reflectometer or an ellipsometer that performs scatterometry modeling. The modeling of the optical data can be performed by a scatterometry modeling unit (not shown).

Figure 5:
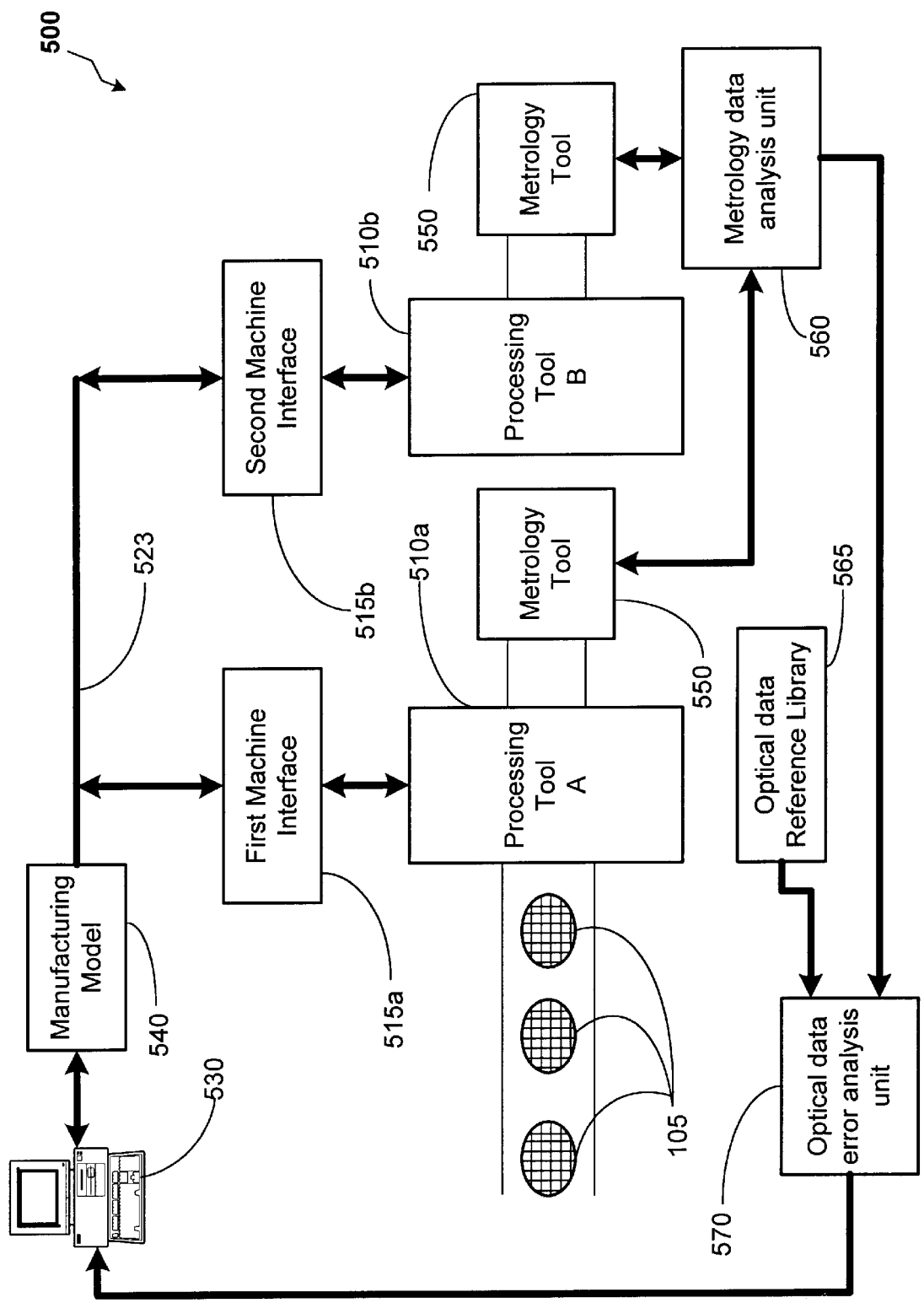
FIG. 5 is a block diagram representation of a system in accordance with one embodiment of the present invention.

Semiconductor devices are processed in a manufacturing environment using a number of input control parameters. Turning now to FIG. 5, a system 500 in accordance with one embodiment of the present invention is illustrated. In one embodiment, semiconductor wafers 105, are processed on processing tools 510a, 510b using a plurality of control input signals, or manufacturing parameters, on a line 523. In one embodiment, control input signals, or manufacturing parameters, on the line 523 are sent to the processing tools 510a, 510b from a computer system 530 via machine interfaces 515a, 515b. In one embodiment, the first and second machine interfaces 515a, 515b are located outside the processing tools 510a, 510b. In an alternative embodiment, the first and second machine interfaces 515a, 515b are located within the processing tools 510a, 510b.

In one embodiment, the computer system 530 sends control input signals, or manufacturing parameters, on the line 523 to the first and second machine interfaces 515a, 515b. The computer system 530 employs a manufacturing model 540 to generate the control input signals on the line 523. In one embodiment, the manufacturing model 540 contains a manufacturing recipe that determines a plurality of control input parameters that are sent on the line 523.

In one embodiment, the manufacturing model 540 defines a process script and input control that implement a particular manufacturing process. The control input signals on the line 523 that are intended for processing tool A 510a are received and processed by the first machine interface 515a. The control input signals on the line 523 that are intended for processing tool B 510b are received and processed by the second machine interface 515b. Examples of the processing tools 510 used in semiconductor manufacturing processes are steppers, step-and-scan tools, etch process tools, diffusion furnaces, polishers, and the like.

One or more of the semiconductor wafers 105 that are processed by the processing tools 510a, 510b can also be sent to a metrology tool 550 for acquisition of metrology data. The metrology tool 550 can be a scatterometry data acquisition tool, an overlay-error measurement tool, a critical dimension measurement tool, and the like. In one embodiment, one or more processed semiconductor wafers 105 are examined by the metrology tool 550. Data from the metrology tool 550 is collected by a metrology data analyzer unit 560. The metrology data analyzer unit 560 organizes, analyses, and correlates scatterometry metrology data acquired by the metrology tool 550 to particular semiconductor wafers 105 that were examined. The metrology data analyzer unit 560 can be a software unit, a hardware unit, or a firmware unit. In one embodiment, the metrology data analyzer unit 560 is integrated into the computer system 530 or may be integrated into the metrology tool 550.

The system 500 comprises an optical data reference library 565. In one embodiment, the optical data reference library 565 comprises data relating to calculated optical data of a plurality of structures on a semiconductor wafer 105. In an alternative embodiment, the optical data reference library 565 comprises data relating to reflected optical data that occurs in response to optical stimuli engaged upon particular structures on a semiconductor wafer 105. A record that contains the response to optical stimuli performed on a plurality of structures, can be organized and stored in the optical data reference library 565, and used as reference for comparison of actual wafer data during manufacturing processes.

The particular reflection profile expected for any structure on a semiconductor wafer 105 depends on the specific geometry of the structure and the parameters of the measurement technique employed by the metrology tool 550, such as a scatterometry tool. The reflection profile for a particular structure includes the bandwidth of the reflected light, the angle of incidence, the intensity and phase of detected light, and the like. The profiles in the optical data reference library 565 are typically calculated theoretically by employing Maxwell's equations based on the characteristics of the structures on the semiconductor wafer 105. It is also contemplated that profiles in the optical data reference library 565 may be confirmed empirically by measuring reflection profiles of sample wafers and subsequent characterization of the measured wafers by destructive or non-destructive examination techniques.

A scatterometry error analysis unit 570 is capable of comparing the metrology data from the metrology data acquisition unit 560 to corresponding data from the optical data reference library 565 and determining if a significant error exists on the structure being analyzed. In one embodiment, the scatterometry error analysis unit 570 is a software unit that resides within the computer system 530. In an alternative embodiment, the scatterometry error analysis unit 570 is a hardware unit that is integrated into the system 500. In yet another embodiment, the scatterometry error analysis unit 570 is a firmware unit integrated within the system 500. The scatterometry error analysis unit 570 can be used by the system 500 to perform fault analysis of the semiconductor wafers 105 being manufactured, which is described in greater detail below. The scatterometry error analysis unit 570 can also be used by the system 500 for feedback process control, which is described in greater detail below.

Figure 6:
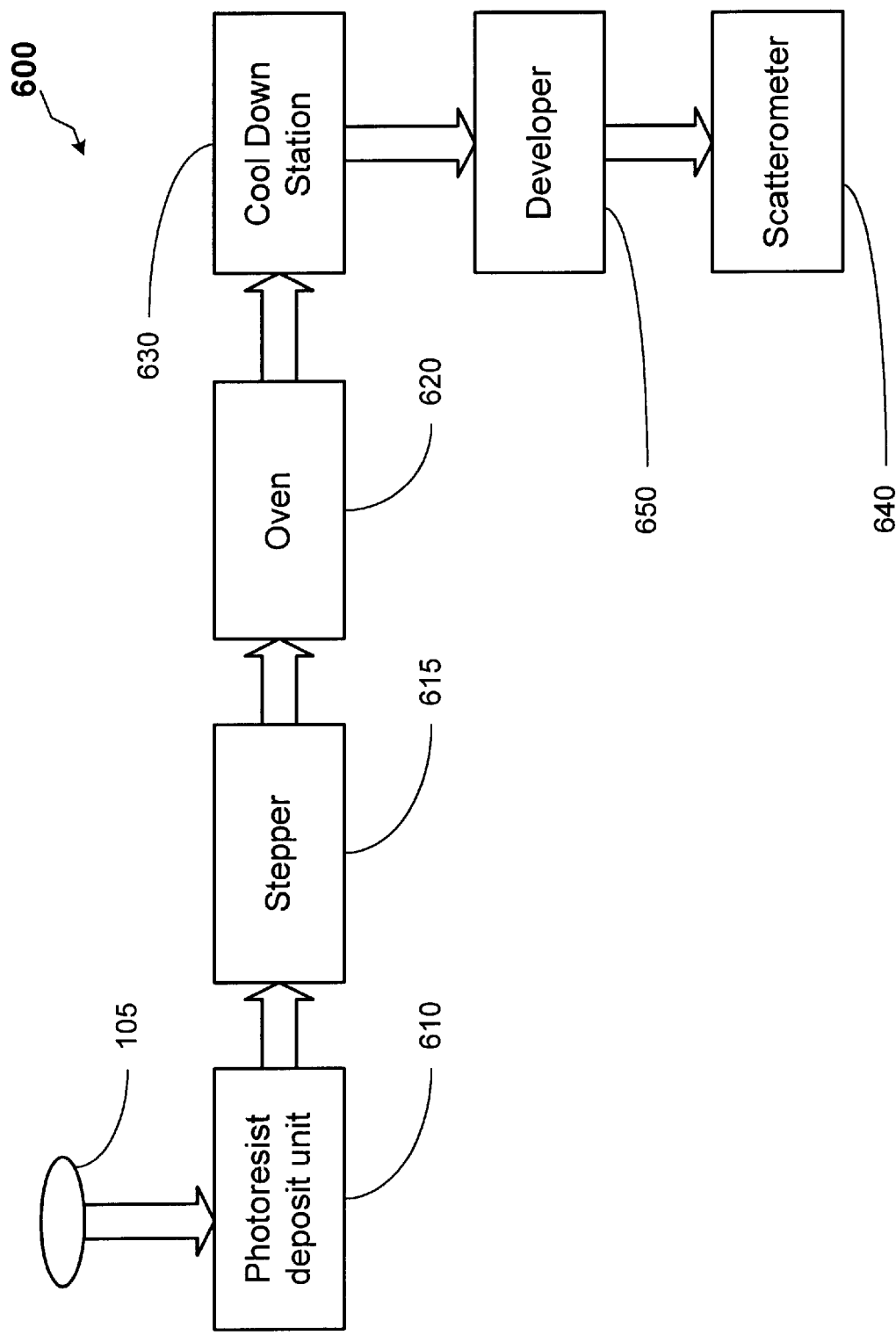
FIG. 6 illustrates one embodiment of a process flow in accordance with one embodiment of the present invention.

One embodiment of an implementation of a scatterometry metrology sequence in the context of semiconductor wafer manufacturing, is shown in FIG. 6, wherein an illustrative processing line 600 for performing photolithography patterning is depicted. The example illustrated in FIG. 6 can be used to optically analyze pre-polish and post-polish process results. The processing line 600 includes a photoresist deposition unit 610, a stepper 615, an oven 620, a cool down station 630, a developer 650, and a scatterometer 640. The photoresist deposition unit 610 receives a semiconductor wafer 105, and forms a layer of photoresist of a predetermined thickness above a process layer formed above the surface of the wafer 105. The stepper 615 then receives the wafer 105 and exposes the photoresist to a light source using a reticle to pattern the layer of photoresist. The wafer 105 is transferred to the oven 620, where a post exposure bake process is conducted. Following the post exposure bake, the wafer 105 is transferred to the cool down station 630, and then to the developer station 650 after the wafer 105 has sufficiently cooled. The soluble photoresist material is removed from the wafer 105 in the developer station 650, thereby resulting in a patterned layer of photoresist.

The wafer 105 is then transferred to the scatterometer 640 for measurements. As described in greater detail below, the scatterometer 640 measures the wafer 105 to determine the acceptability and/or uniformity of the previously performed photolithography processes. The computer system 530, which is integrated with the APC framework, based on the wafer measurements, can adjust the recipe of the stepper 615, as needed. As will be recognized by those of ordinary skill in the art in light of this disclosure, the processing line 600 may include discrete or integrated processing tools for performing the processing steps described herein. The data acquired by the scatterometer 640 is used for making modifications to the control input signals on the line 523, which control the processing tools 510.

Figure 7:
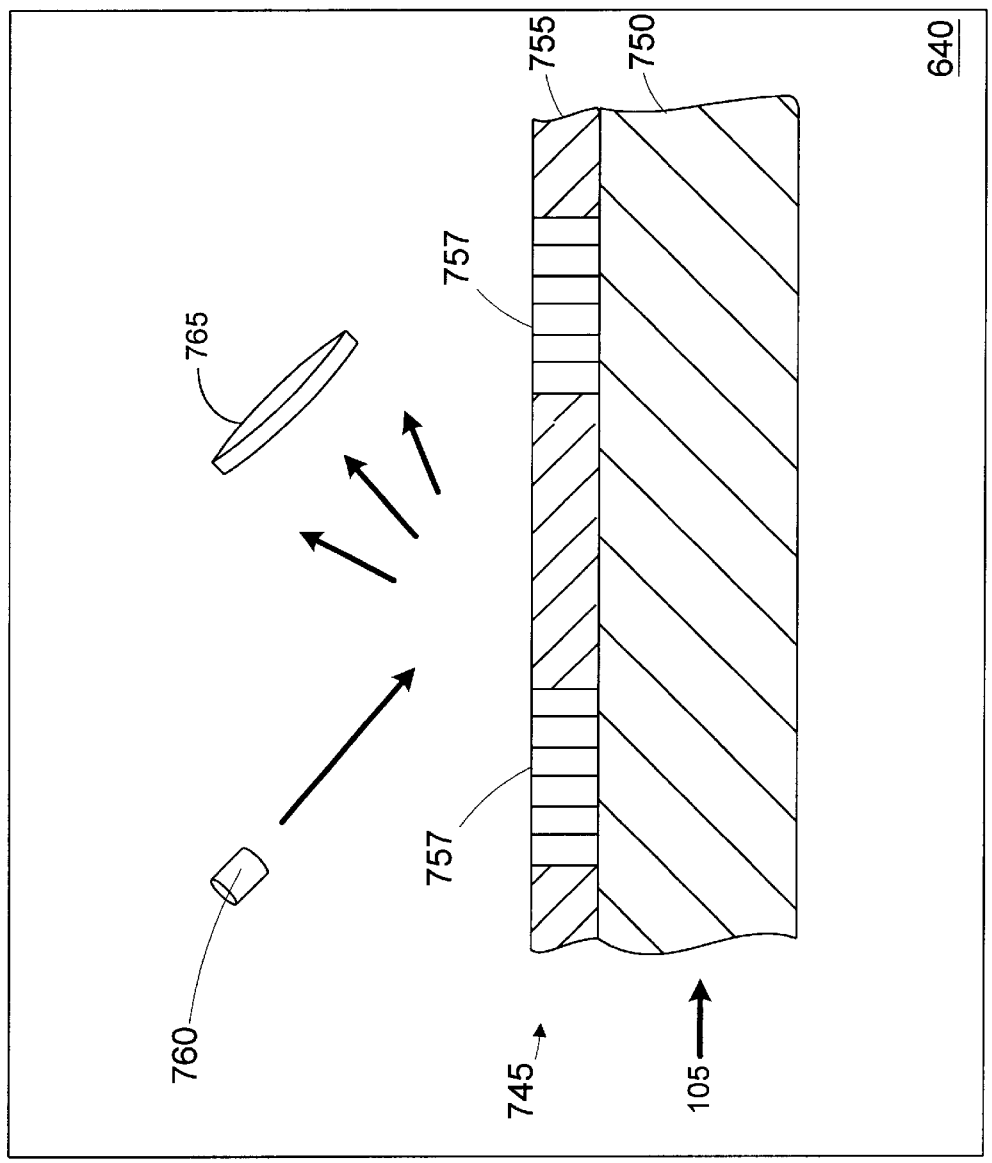
FIG. 7 illustrates a simplified view of a scatterometer with the semiconductor wafer loaded therein.

Referring to FIG. 7, a simplified view of an illustrative scatterometer 640 with the wafer 105 loaded therein is provided. The wafer 105 has a base material 750. The photoresist layer 755 has regions 757 formed on the base material 750 resulting from the previous exposure and baking steps (i.e., referred to as a patterned photoresist layer 755). The chemical change resulting in the change in solubility of the regions 757 also results in the regions 757 having an index of refraction different than that of the unexposed portions of the photoresist layer 755.

In one embodiment, the scatterometer 640 comprises a light source 760 and a detector 765 positioned proximate the wafer 105. The light source 760 of the scatterometer 640 illuminates at least a portion of the wafer 105, and the detector 765 takes optical measurements, such as intensity, of the reflected light. Although the invention is described using a scatterometer 640 designed to measure reflected light intensity, it is contemplated that other measurement tools, such as an ellipsometer, a reflectometer, a spectrometer, or some other light-measuring device may be used. It is also contemplated that the scatterometer 640 may use monochromatic light, white light, or some other wavelength or combinations of wave-lengths, depending on the specific implementation. The angle of incidence of the light may also vary, depending on the specific implementation.

The differences in the refractive indices for the regions 757 and the unexposed portions of the photoresist layer 755 cause light scattering, resulting in a decrease in the intensity of the reflected light as compared to scattering in the photoresist layer 755 before exposure and/or baking. The scatterometer 640 measures the intensity at different points on the wafer 105, such as on the periphery and in the middle. A difference in the light intensity between various points indicates a nonconformity, such as a variation in the line widths of the regions 757. The light analyzed by the scatterometer 640 typically includes a reflected component and a scattered component. The reflected component corresponds to the light component where the incident angle equals the reflected angle. The scattered component corresponds to the light component where the incident angle does not equal the reflected angle. For purposes of discussion hereinafter, the term "reflected" light is meant to encompass either or both the reflected component and the scattered component.

The computer system 530, in conjunction with the manufacturing model 540, adjusts the recipe of the stepper 615 to correct the nonconformity. For example, if the intensity measurement on the periphery 162 of the wafer 105 (see FIG. 1) is greater than the intensity measurement in the middle 164, the line width is presumably less, because a smaller line width causes less scattering. To correct the line width variation, the computer system 530 changes the recipe of the stepper 615 such that the exposure sites (e.g., individual die or groups of die) with smaller line widths receive either an increased energy exposure or a longer duration exposure.

In an alternative embodiment, scatterometry measurements can be made before performing the develop process. Detecting variations and adjusting the stepper 615 recipe prior to the performing the develop process allows for a quicker corrective action response. It is contemplated that all of the wafers 105 in a lot may be tested, or only selected wafers 105 in the lot. Identifying variations early allows correction of wafers 105 within the same lot. For more stable steppers 615, the scatterometer 640 may be used only once per shift or once per week, depending on the specific implementation.

In the illustrated embodiment, the photoresist layer 755 is of a chemically-amplified type. In cases where a non-chemically-amplified photoresist material is used, the scatterometer 640 may be stationed prior to the oven 620. In a non-amplified photoresist system, the pattern is essentially complete after exposure in the stepper 615. The post exposure bake in the oven 620, which may be optional, is conducted to smooth the edges in the pattern resulting from standing waves, rather than to complete the patterning. Thus, the exposed portions already have an index of refraction different than the unexposed patterns, and the scatterometer 540 may be used. Scatterometry measurements can also be made on STI structures. The thickness of silicon dioxide, using TEOS, used to fill STI structures 240 can be measured using the scatterometry techniques listed above. Scatterometry data is processed and correlated by the system 500. The scatterometry data is then analyzed by the scatterometry error analysis unit 170. The results from the scatterometry error analysis unit 170 can be used to adjust various STI structure 240 formation processes, such as polishing processes of TEOS layers and fillings of STI structures 240.

Figure 8:
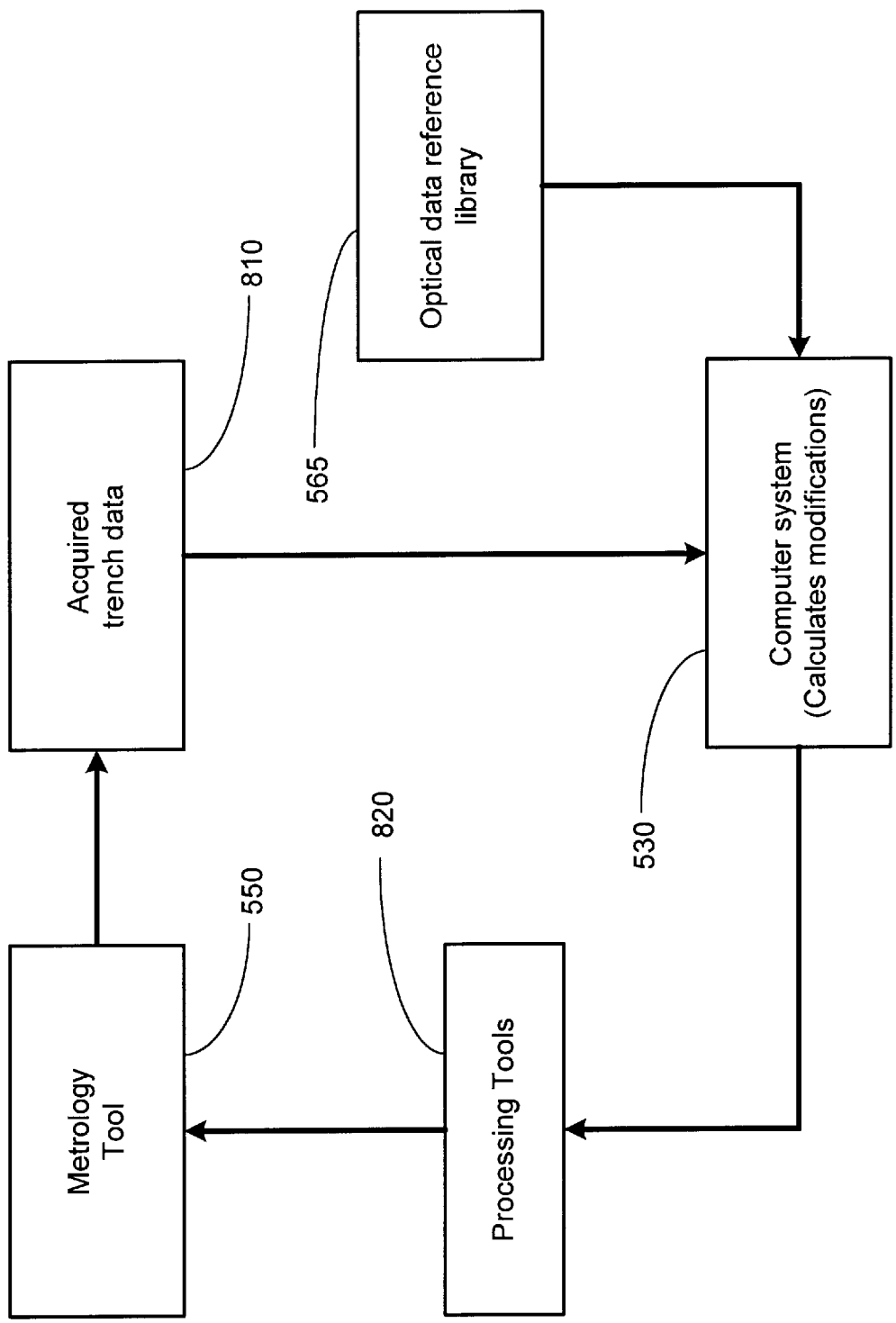
FIG. 8 illustrates block diagram representation of a process feedback path in accordance with one embodiment of the present invention.

Turning now to FIG. 8, a simplified block diagram representation of a feedback flow in accordance with one embodiment of the present invention, is illustrated. The metrology tool 550, which in one embodiment is a scatterometry tool, provides acquired trench data 810 comprising data relating to a depth of the silicon trench etched at the STI layer. The acquired trench data 810 also includes data relating to the amount of nitrate film that has been polished off the semiconductor wafer 105, a field thickness, critical dimension measurement of the STI structure 240, seams 310, keyholes 320, and the like. In one embodiment, the acquired trench data 810 is stored in memory. In one embodiment, the system 500 forwards the acquired trench data 810 to the computer system 530. The computer system 530 also receives library data that corresponds to the acquired trench data 810, from the optical data reference library 565. The computer system 530 then compares the library data with the acquired trench data 810 to determine STI structure characteristics.

The computer system 530 then calculates modification parameters for subsequent wafer processing. The modification parameters are then sent to one of the processing tools 820 to perform one of several processes, such as an etch process, TEOS filling of STI structures 240, silicon nitride strip process, and the like. In one embodiment, dishing is defined as an uneven filling of material in a trench. The semiconductor wafers 105 that are processed by one of the processing tools 820 are then analyzed by the metrology tool 550, repeating the feedback cycle. In one embodiment, the apparatus illustrated in FIG. 8 can be utilized by the system 500 in order to perform depth STI structure depth measurements, detection of seams 310 and/or keyholes 320, losses in field oxide 410, and the like.

Once the computer system 530 determines the errors and evaluates the quality of the previous process, adjustments data is sent to the processing tools 520 to the utilized for a subsequent manufacturing process. For example, results from the etch process is examined by the computer system 530 and the resulting optical analysis will result in control input parameters that are newly calculated for a subsequent process, such as a TEOS fill process to fill the STI structures 240 that were formed during the previous etch process. Again, the metrology tool 550 is utilized to acquire optical data and the analysis is repeated to produce control input parameters modifications that are implemented during the next processing phase, such as a polish process. Subsequently, scatterometry data acquisition and analysis processing is repeated to produce control input parameters for the next process step, such as a nitride strip process. This feedback and adjustment loop is continued until the semiconductor wafer processing is substantially complete Turning now to FIG. 9, a flow chart depiction of one embodiment of a method in accordance with the present invention, is illustrated. In one embodiment, an etch process is performed on a first set of semiconductor wafer 105 (block 910). Subsequent to the etch process, the system 400 performs an optical data acquisition process to acquire optical data from the semiconductor wafer 105 (block 920). The optical data that is acquired includes data relating to the depth of the STI structures 240, critical dimensions within the STI structures 240, the profile of the STI structures 240, and the like. The optical data is then used to perform an inline trench analysis (block 930). A more detailed description of the inline trench analysis is provided below.

Upon completion of the inline trench analysis, in one embodiment, a feedback process is performed (block 940). A more detailed description of the feedback process of block 940 is provided below. The feedback process is used to modify control input parameters (e.g., an etch-time) of following etch processes performed on a subsequent set of semiconductor wafers. In one embodiment, the inline trench analysis of block 930 is also used to perform a feed-forward corrective process (block 950). A more detailed description of the feed forward process of block 950 is described below. The feed forward process is used to compensate for the errors relating to the STI structures 240, or reduce the effects of the errors, by modifying control input parameters of the deposition and polish steps performed upon the first set of semiconductor wafers.

Subsequently, the first set of semiconductor wafers 105 is sent through a trench fill process (block 960). In one embodiment, silicon dioxide using TEOS, is deposited on the silicon substrate 210 and other layers, such as a silicon nitride layer 220, and into the STI structures 210. Once a trench fill process is performed, an optical data acquisition step is again performed on the first set of semiconductor wafers 105 (block 970). The optical data acquisition process of block 970 yields data such as the seams 310 (size and location), keyholes 320, and the like. The system 500 then performs an inline trench analysis using the optical data that includes the seams 310 and keyhole 320 data (block 975). The inline trench analysis of block 975 is used to perform another feedback process that can be used modify the control input parameters of a trench fill process performed on a second set of semiconductor wafers (block 980). The inline trench analysis is also used to perform a feed forward process, which is designed to reduce the effects of the errors that occured during the trench fill process on the STI polish process (block 985).

Subsequently, a polish and/or a silicon nitride strip process are performed on the first set of semiconductor wafers 105 (block 990). Again, an optical data acquisition is performed to acquire process data such as detecting keyholes 320, trench fill level, and the like. Similar to the steps described above, an inline trench analysis is performed using the optical data from the optical data analysis of block 992 (block 995). Subsequently, a feedback process is performed using the inline trench analysis of block 995 to correct errors during processing of a second set of semiconductor wafers being processed in a polish and/or a nitride strip processing tool (block 996). Also, the inline trench analysis of block 995 is used to perform a feed forward process to reduce the effects of keyholes and fill level errors (block 997).

Figure 10:
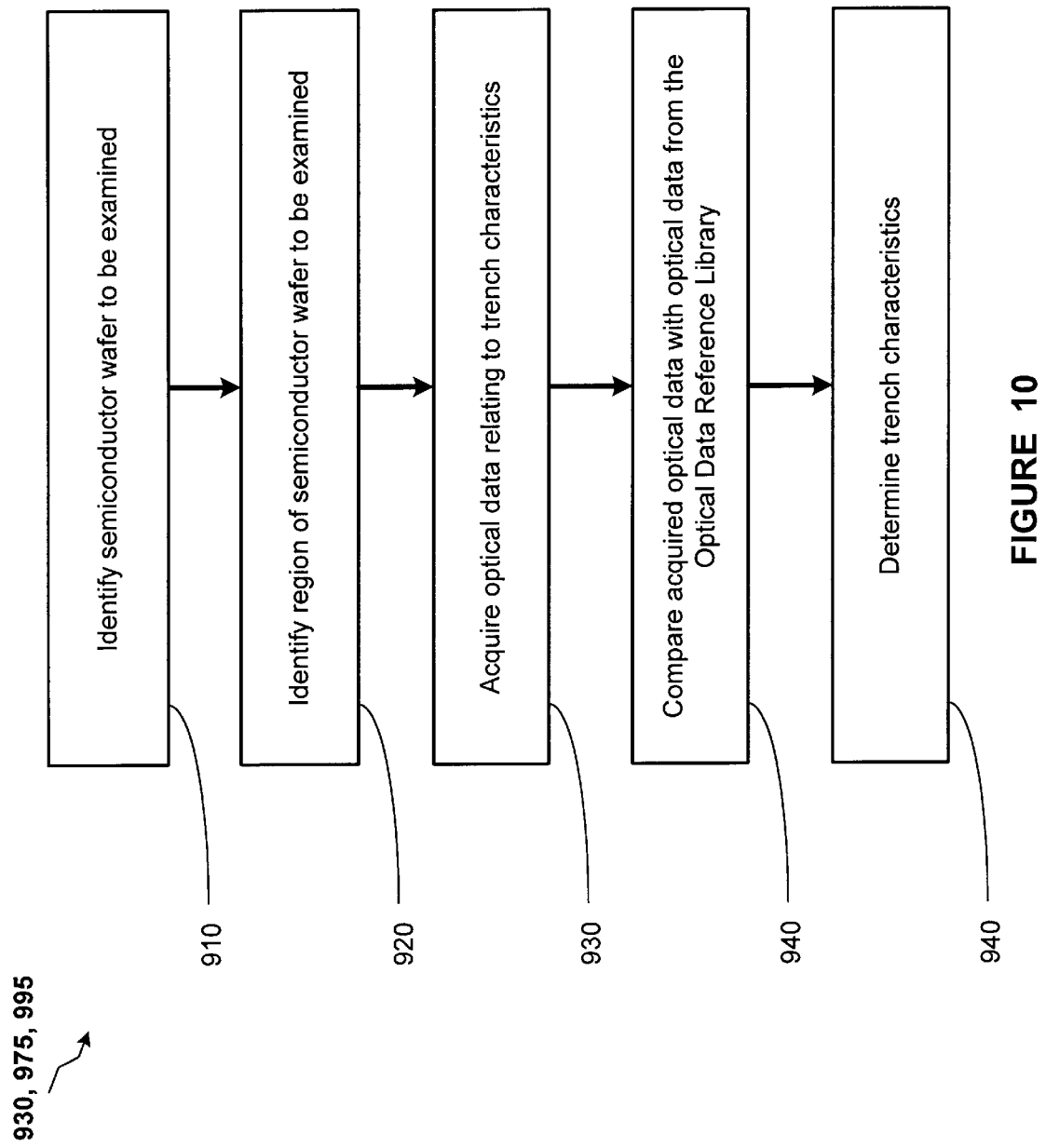
FIG. 10 illustrates a flowchart depiction of a method of performing an inline trench analysis described in FIG. 9, in accordance with one embodiment of the present invention.

Turning now to FIG. 10, a more detailed flowchart depiction of the steps of one embodiment of performing the inline trench analysis process (as indicated in blocks 930, 975, and 995), is illustrated. The system 500 identifies semiconductor wafers 105 that are to be examined for trench or STI structure analysis (block 1010). Furthermore, the system 500 identifies an examination region of the semiconductor wafer 105 that was selected for trench analysis (block 1020). Once a region on a semiconductor wafer 105 is selected for trench examination, the system 500 acquires optical data relating to characteristics of the STI structures (block 1030). In one embodiment, the optical data acquired comprises scatterometry data. The optical data that is acquired can lead to a determination of trench characteristics such as depth of the silicon nitrate deposit, the amount of polishing performed on the silicon nitrate or silicon oxide film, at least one dishing parameter, the field thickness, and the like. These trench characteristics can be used to make modifications to subsequent wafer processes.

The acquired optical data relating to the semiconductor wafer 105 being examined is compared with data in the optical data reference library 565 (block 1040). The comparison of the acquired optical data and the stored optical data reference library 565 data is used by the system 500 to determine STI structure 240 characteristics of the semiconductor wafer 105 being examined (block 1050). Those skilled in the art would have the benefit of the present disclosure can compare calculated or measured optical data stored in the optical data reference library 565 with acquired optical data provided by metrology tool 530 to estimate the approximate STI structure 240 characteristics of the wafer 105 being examined. The completion of the steps described in FIG. 10 substantially completes the process of performing inline trench analysis, which is indicated in blocks 930, 975, and 995 of FIG. 9.

Figure 9:
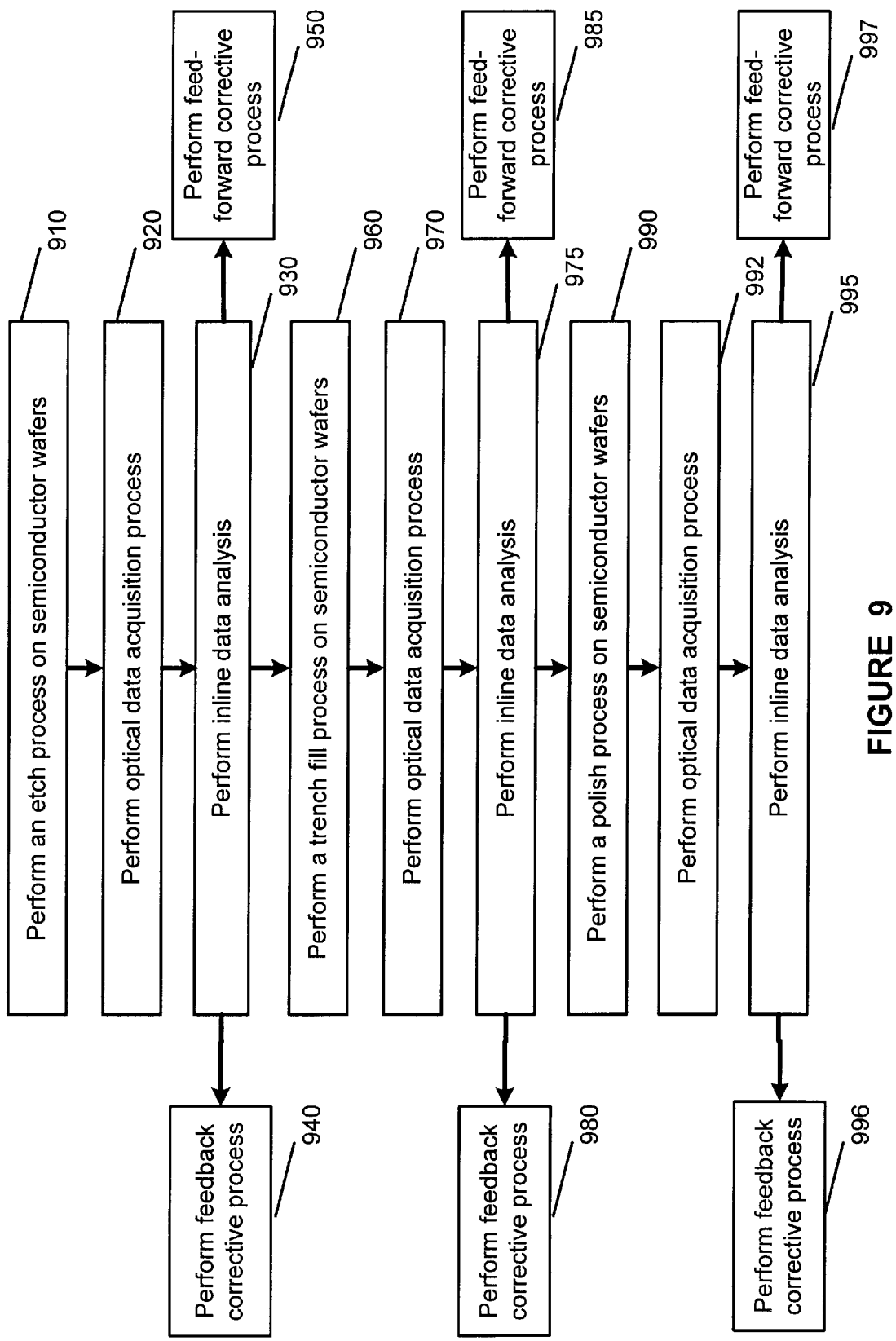
FIG. 9 illustrates a flowchart depiction of a method in accordance with one embodiment of the present invention.
Figure 11:
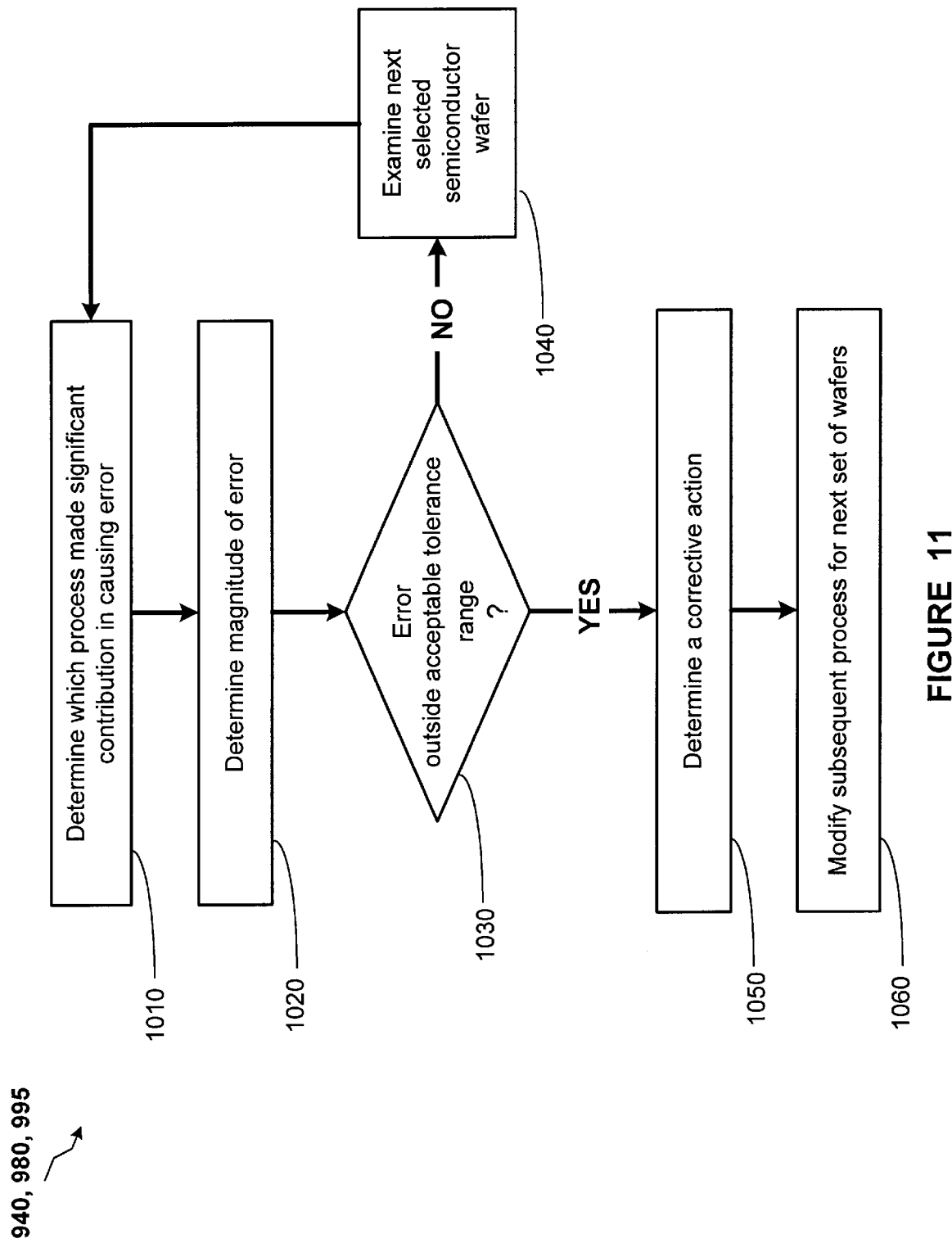
FIG. 11 illustrates a flowchart depiction of a method of performing a feedback process described in FIG. 9, in accordance with one embodiment of the present invention.

Turning now to FIG. 11, a flowchart depiction of one embodiment of performing the feedback correction described in blocks 940, 975, 996 of FIG. 9, is illustrated. Based upon the optical trench analysis, the system 500 makes a determination as to which particular semiconductor wafer process was likely to have caused the error detected (block 1110). Many times, post-polish process analysis can lead to detection of errors that may have been caused either by a previous polish process or an etch process performed before the polish process. Post-polish error includes trench errors, such as excessive dishing effects. Using the teachings of the present invention, a more global view of the manufacturing environment is possible, such that those skilled in the art who have the benefit of the present disclosure can use the results of the optical trench analysis to determine whether an error was caused by a previous polish operation or a previous etch operation. The system 500 also makes a determination whether the magnitude of the error detected is within a predetermined tolerance range (block 1120, 1130). When the system 500 determines that the error detected is with an acceptable margin of error, the system examines the next selected wafer 115 and repeats the steps described in blocks 1110–1030 (block 1140).

When the system 500 makes a determination that the detected error is outside a predetermined acceptable range, the system 500 determines a corrective action in response to the error (block 1150). In one embodiment, the system 500 to modifies the manufacturing model 140 using the computer system 530 to determine possible corrective actions. For example, the system 500 may determine that additional polishing of the TEOS is required to fill the STI structures 240 properly. The system 500 then modifies a subsequent process for the second set of semiconductor wafers 105 undergoing the same process (block 1160)], in order to compensate for the previous process step that caused the error detected by the inline trench analysis process. The completion of the steps described in FIG. 11 substantially completes the process of performing feedback corrections as indicated in blocks 940, 980, and 996 of FIG. 9.

As indicated in FIG. 9, the system 500 can also perform feed-forward modifications of trench characteristics in response to the inline trench analysis (blocks 950, 985, and 997). The feed-forward modifications are made to first set of semiconductor wafers 105 to compensate and/or reduce the effects of the errors calculated by the inline trench analysis processes. A more detailed flowchart depiction of the process of performing feed-forward modifications in accordance with one embodiment of the present invention, is illustrated in FIG. 12.

Figure 12:
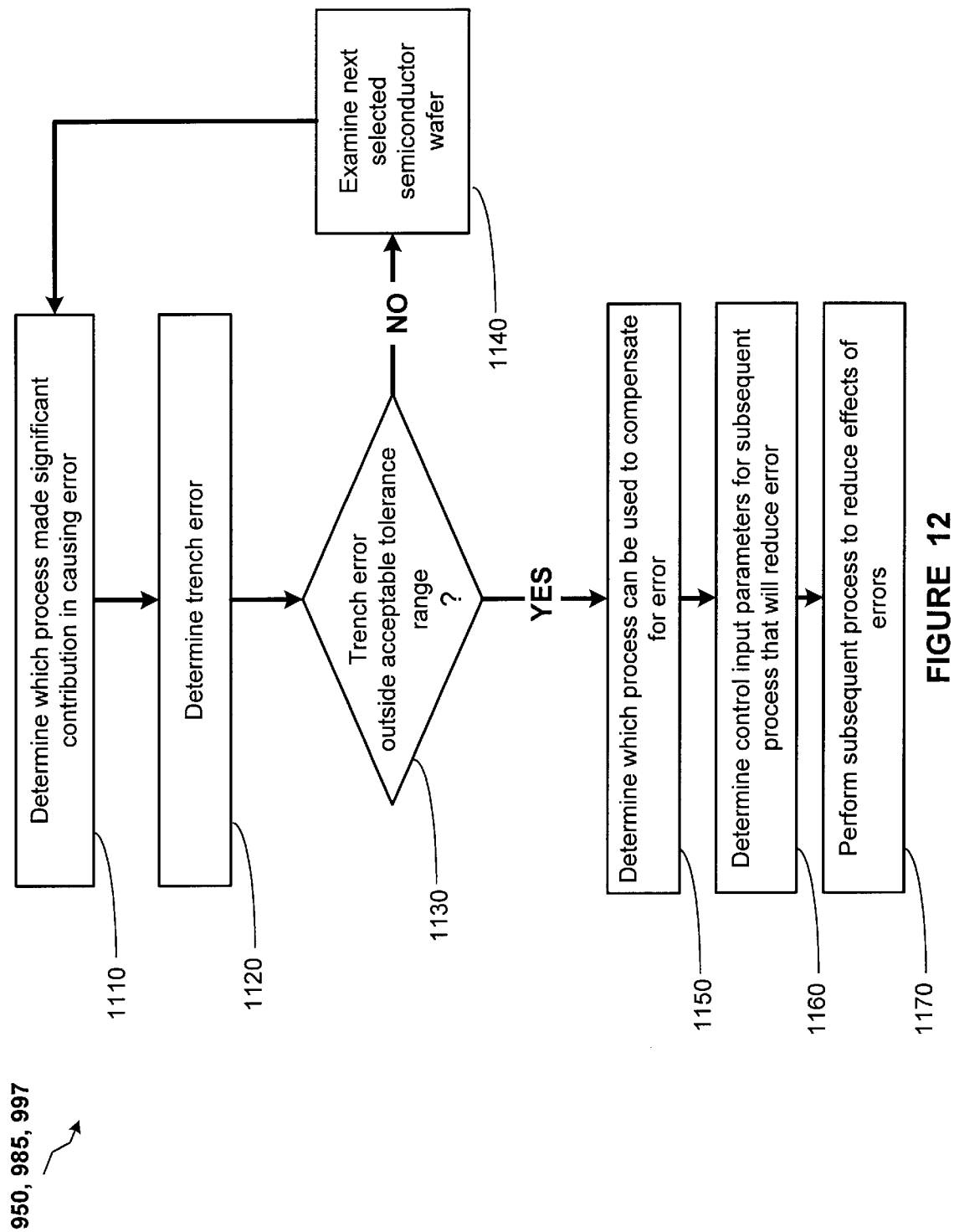
FIG. 12 illustrates a flowchart depiction of a method of performing a feed-forward process described in FIG. 9, in accordance with one embodiment of the present invention.

Turning now to FIG. 12, in one embodiment, the system 500 determines which previous process was likely to have significantly contributed to the error detected using the optical trench analysis (1210). Using the data acquired by the optical trench analysis, the system 500 calculates the amount of error and the trench characteristics, such as dishing effects (block 1220). The system 500 then makes a determination whether the calculated error is above a predetermined tolerance threshold (block 1230). When the system 500 determines that the detected error is not significant, (i.e., the errors are within a predetermined acceptable range), the system 500 examines the next wafer selected for optical examination (1240).

When the system 500 determines that a significant error has occurred, the system 500 determines the amount of process (e.g., CMP process) adjustments to be made in order to reduce the effects of the error (block 1250). For example the system 500 may determine that additional processing correction is required in order to polish the TEOS down to an approximate level of a layer of silicon nitrate deposited on the semiconductor wafer 105 being processed.

The system 500 determines which process can be used to reduce or compensate for the error determined by an inline trench analysis process (block 1250). The determination of the process that can be used to compensate for the error, or reduce the error, is used to determine new control input parameters for the subsequent process (block 1260). The control input parameters are then used to perform the subsequent process that may reduce the errors, or compensate for the errors (block 1270). In one embodiment, the modified control input parameters integrated into the manufacturing model 540, which is used to modify subsequent processes performed in the first set of semiconductor wafers 105.

Using the steps described in FIGS. 9–12, optical data analysis is used to track, monitor, and compensate for errors in STI structures 240 over the course of their manufacturing lifespan. Furthermore, the system 500 can use the steps described in FIGS. 9–11 to perform fault detection and implement corrective measures in response to errors detected by the fault detection.

The principles taught by the present invention can be implemented in an Advanced Process Control (APC) Framework. The APC is a preferred platform from which to implement the control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing a plurality of process steps on at least a portion of a first set of semiconductor wafers;
   performing a manufacturing tracking of trench features, said manufacturing tracking of trench features comprises using optical data for tracking at least one trench feature during a plurality of processes performed on said at least a portion of said first set of semiconductor wafers; and
   performing at least one of a feedback corrective process on at least a portion of a second set of semiconductor wafers and a feed-forward corrective process on at least a portion of said first set of semiconductor wafers based upon a measurement resulting from performing said manufacturing tracking of trench features.

2. The method described in claim 1, wherein performing a manufacturing tracking of trench features further comprises:
   performing a first process on at least one semiconductor wafer;
   acquiring optical trench data from said processed semiconductor wafer;
   performing an inline trench analysis based upon said optical trench data;
   performing a corrective feedback step on a second processing of said semiconductor wafer in response to said optical trench analysis;
   acquiring optical trench data from said processed semiconductor wafer in response said second processing of said semiconductor wafer;
   performing an inline trench analysis based upon said optical trench data from said second processing of said semiconductor wafer.

3. The method described in claim 2, further comprising generating said reference library that comprises optical data relating to characteristics of a plurality of optical trench data.

4. The method described in claim 2, wherein performing said first process on said semiconductor wafer comprises performing an etch process on said semiconductor wafer.

5. The method described in claim 2, wherein performing said second process on said semiconductor wafer comprises performing a trench fill process on said semiconductor wafer.

6. The method described in claim 2, further comprising performing a third process on said semiconductor wafer in response to said inline trench analysis performed based on said second processing of semiconductor wafer.

7. The method described in claim 6, wherein performing said third process on said semiconductor wafer comprises performing a polishing process on said semiconductor wafer.

8. The method described in claim 7, wherein performing a polishing process on said semiconductor wafer further comprises performing a chemical-mechanical planarization process on said semiconductor wafer.

9. The method described in claim 2, wherein acquiring optical trench data from said processed semiconductor wafer further comprises acquiring optical data from at least one shallow trench isolation structure on said processed semiconductor wafer.

10. The method described in claim 9, wherein acquiring optical trench data from said processed semiconductor wafer further comprises acquiring scatterometry data.

11. The method described in claim 2, wherein performing an inline trench analysis based upon said optical trench data further comprises:
   identifying a region on said semiconductor wafer for optical analysis;
   acquiring optical data from said region;
   comparing said acquired optical data with data from said optical data reference library; and
   determining at least one trench characteristic based upon said comparison of said acquired optical data and said data from said optical reference library.

12. The method described in claim 11, wherein determining at least one trench characteristic further comprises determining at least one of a depth of a trench fill material, a seam, a keyhole, an amount of polishing performed on a layer of silicon nitride, an amount of polishing performed on a layer of silicon oxide film, and at least one field thickness.

13. The method described in claim 2, further comprising performing a feed-forward modification in response to said inline trench analysis.

14. The method described in claim 13, wherein performing a feed-forward modification in response to said optical trench analysis further comprises:

calculating at least one trench error;

determining whether said trench error is outside a predetermined tolerance level;

identifying a process that can be used to reduce an effect of said trench error in response to a determination that said trench error is outside a predetermined tolerance level;

determining an adjustment for at least one control input parameter of said process that can be used to reduce an effect of said trench error; and performing said process that can be used to reduce an effect of said trench error on said semiconductor wafers, based on said adjustments.

15. The method described in claim 2, wherein performing a corrective feedback step on a second processing of said semiconductor wafer in response to said optical trench analysis further comprises:

determining a process step that significantly contributed to a process error based upon said optical trench analysis;

determining whether said process error is outside a predetermined tolerance level; determining a corrective action in response to a determination that said process error is outside a predetermined tolerance level; and performing said process step based on said corrective action on a subsequent set of semiconductor wafers.

16. The method described in claim 15, wherein determining a corrective action further comprises determining a modification of at least one control input parameter.

17. The computer readable program storage device encoded with instructions that, when executed by a computer, performs the method described in claim 2, wherein acquiring optical trench data from said processed semiconductor wafer further comprises acquiring optical data from at least one shallow trench isolation structure on said processed semiconductor wafer.

18. The computer readable program storage device encoded with instructions that, when executed by a computer, performs the method described in claim 17, wherein acquiring optical trench data from said processed semiconductor wafer further comprises acquiring scatterometry data.

19. An apparatus, comprising:

means for performing a plurality of process steps on at least a portion of a first set of semiconductor wafers;

means for performing a manufacturing tracking of trench features, said means for manufacturing tracking of trench features comprises means for using optical data for tracking at least one trench feature during a plurality of processes performed on said at least one portion of said first set of semiconductor wafers; and means for performing at least one of a feedback corrective process on at least a portion of a second set of semiconductor wafers and a feed-forward corrective process on at least a portion of said first set of semiconductor wafers based upon a measurement resulting from performing said manufacturing tracking of trench features.

20. A computer readable program storage device encoded with instructions that, when executed by a computer, performs a method, comprising:

performing a plurality of process steps on at least a portion of a first set of semiconductor wafers;

performing a manufacturing tracking of trench features, said manufacturing tracking of trench features comprises using optical data for tracking at least one trench feature during a plurality of processes performed on said at least one portion of said first set of semiconductor wafers; and performing at least one of a feedback corrective process on at least a portion of a second set of semiconductor wafers and a feed-forward corrective process on at least a portion of said first set of semiconductor wafers based upon a measurement resulting from performing said manufacturing tracking of trench features.

21. The computer readable program storage device encoded with instructions that, when executed by a computer, performs the method described in claim 20, wherein performing a manufacturing tracking of trench features further comprises:

performing a first process on at least one semiconductor wafer;

acquiring optical trench data from said processed semiconductor wafer;

performing an inline trench analysis based upon said optical trench data;

performing a corrective feedback step on a second processing of said semiconductor wafer in response to said optical trench analysis;

acquiring optical trench data from said processed semiconductor wafer in response said second processing of said semiconductor wafer;

performing an inline trench analysis based upon said optical trench data from said second processing of said semiconductor wafer.

22. The computer readable program storage device encoded with instructions that, when executed by a computer, performs the method described in claim 21, further comprising generating said reference library that comprises optical data relating to characteristics of a plurality of optical trench data.

23. The computer readable program storage device encoded with instructions that, when executed by a computer, performs the method described in claim 21, wherein performing said first process on said semiconductor wafer comprises performing an etch process on said semiconductor wafer.

24. The computer readable program storage device encoded with instructions that, when executed by a computer, performs the method described in claim 21, wherein performing said second process on said semiconductor wafer comprises performing a trench fill process on said semiconductor wafer.

25. The computer readable program storage device encoded with instructions that, when executed by a computer, performs the method described in claim 21, further comprising performing a third process on said semiconductor wafer in response to said inline trench analysis performed based on said second processing of semiconductor wafer.

26. The computer readable program storage device encoded with instructions that, when executed by a computer, performs the method described in claim 25, wherein performing said third process on said semiconductor wafer comprises performing a polishing process on said semiconductor wafer.

27. The computer readable program storage device encoded with instructions that, when executed by a computer, performs the method described in claim 26, wherein performing a polishing process on said semiconductor wafer further comprises performing a chemical-mechanical planarization process on said semiconductor wafer.

28. The computer readable program storage device encoded with instructions that, when executed by a computer, performs the method described in claim 21, wherein performing an inline trench analysis based upon said optical trench data further comprises:
   identifying a region on said semiconductor wafer for optical analysis;
   acquiring optical data from said region;
   comparing said acquired optical data with data from said optical data reference library; and
   determining at least one trench characteristic based upon said comparison of said acquired optical data and said data from said optical reference library.

29. The computer readable program storage device encoded with instructions that, when executed by a computer, performs the method described in claim 28, wherein determining at least one trench characteristic further comprises determining at least one of a depth of a trench fill material, a seam, a keyhole, an amount of polishing performed on a layer of silicon nitrate, an amount of polishing performed on a layer of silicon oxide film, and at least one field thickness.

30. The computer readable program storage device encoded with instructions that, when executed by a computer, performs the method described in claim 21, further comprising performing a feed-forward modification in response to said inline trench analysis.

31. The computer readable program storage device encoded with instructions that, when executed by a computer, performs the method described in claim 30, wherein performing a feed-forward modification in response to said optical trench analysis further comprises:
   calculating at least one trench error;
   determining whether said trench error is outside a predetermined tolerance level;
   identifying a process that can be used to reduce an effect of said trench error in response to a determination that said trench error is outside a predetermined tolerance level;
   determining an adjustment for at least one control input parameter of said process that can be used to reduce an effect of said trench error; and
   performing said process that can be used to reduce an effect of said trench error on said semiconductor wafers, based on said adjustments.

32. The computer readable program storage device encoded with instructions that, when executed by a computer, performs the method described in claim 21, wherein performing a corrective feedback step on a second processing of said semiconductor wafer in response to said optical trench analysis further comprises:
   determining a process step that significantly contributed to a process error based upon said optical trench analysis;
   determining whether said process error is outside a predetermined tolerance level;
   determining a corrective action in response to a determination that said process error is outside a predetermined tolerance level; and
   performing said process step based on said corrective action on a subsequent set of semiconductor wafers.

33. The computer readable program storage device encoded with instructions that, when executed by a computer, performs the method described in claim 32, wherein determining a corrective action further comprises determining a modification of at least one control input parameter.

34. A system, comprising:
   a processing tool for processing at least a portion of a first set and a second set of semiconductor wafers; and
   a controller operatively coupled to said processing tool, said controller: to control processing of said first and second sets of semiconductor wafers; to use optical data to track at least one trench feature on at least one of said semiconductor wafers during a plurality of processes performed on said semiconductor wafer; and to perform at least one of a feedback corrective process on at least a portion of a second set of semiconductor and a feed-forward corrective process on at least a portion of said first set of semiconductor wafers based upon at least one measurement resulting from tracking of said trench feature.

35. The system of claim 34, further comprising:
   a computer system operatively coupled to said controller;
   a manufacturing model coupled with said computer system, said manufacturing model being capable of generating and modifying at least one control input parameter signal for controlling an operation of said processing tool;
   a machine interface coupled with said manufacturing model, said machine interface being capable of receiving process recipes from said manufacturing model;
   said processing tool capable of processing semiconductor wafers and coupled with said machine interface, said first processing tool being capable of receiving at least one process recipe from said machine interface;
   a metrology tool coupled with said processing tool and, said metrology tool being capable of acquiring metrology data relating to said semiconductor wafer;
   an optical data reference library, said scatterometry reference library comprising optical data related to a plurality trench data; and
   an optical data error analysis unit coupled to said metrology tool and said optical data reference library, said optical data error analysis unit capable of comparing said metrology data to corresponding data in said optical data reference library and performing a process tracking of trench features.

36. The system of claim 35, wherein said trench data is a shallow trench isolation structure data.

37. The system of claim 36, wherein said trench error is a shallow trench isolation structure error.

38. The system of claim 35, wherein said computer system is capable of generating modification data for modifying at least one control input parameter in response to said calculation of said trench error.

39. The system of claim 20, wherein said manufacturing model is capable of modifying said control input parameter in response to said modification data.

40. The system of claim 35, wherein said metrology tool is at least one of a reflectometer and an ellipsometer coupled with a scatterometry modeling unit.

* * * * *

UNITED STATES PATENT AND TRADEMARK OFFICE
CERTIFICATE OF CORRECTION

PATENT NO. : 6,625,514 B1
DATED : September 23, 2003
INVENTOR(S) : Kevin R. Lensing Page 1 of 1

It is certified that error appears in the above-identified patent and that said Letters Patent is hereby corrected as shown below:

Column 1,
Line 42, replace "tetraethoxysilane to (TEOS)" with -- tetraethoxysilane (TEOS) --.

Column 10,
Line 23, replace "to modifies" with -- modifies --.

Column 16,
Line 60, replace "20" with -- 38 --.

Signed and Sealed this

Twentieth Day of January, 2004

JON W. DUDAS
*Acting Director of the United States Patent and Trademark Office*